US006798206B2

(12) United States Patent
Misic

(10) Patent No.: US 6,798,206 B2
(45) Date of Patent: Sep. 28, 2004

(54) NEUROVASCULAR COIL SYSTEM AND INTERFACE AND SYSTEM THEREFOR AND METHOD OF OPERATING SAME IN A MULTITUDE OF MODES

(75) Inventor: George J. Misic, Allison Park, PA (US)

(73) Assignee: Medrad, Inc., Indianola, PA (US)

( * ) Notice: Subject to any disclaimer, the term of this patent is extended or adjusted under 35 U.S.C. 154(b) by 0 days.

(21) Appl. No.: 10/178,594

(22) Filed: Jun. 24, 2002

(65) Prior Publication Data

US 2002/0190716 A1 Dec. 19, 2002

Related U.S. Application Data

(63) Continuation-in-part of application No. 10/082,818, filed on Feb. 25, 2002, which is a continuation of application No. 09/449,255, filed on Nov. 24, 1999, now Pat. No. 6,356,081

(60) Provisional application No. 60/109,820, filed on Nov. 25, 1998.

(51) Int. Cl.⁷ ................................................. G01V 3/00
(52) U.S. Cl. ...................................... 324/322; 324/318
(58) Field of Search ................................ 324/318, 322, 324/300, 306, 307, 309, 312, 314

(56) References Cited

U.S. PATENT DOCUMENTS

| 4,634,980 A | 1/1987 | Misic et al. |
| 4,684,895 A | 8/1987 | Misic |
| 4,692,705 A | 9/1987 | Hayes |
| 4,731,584 A | 3/1988 | Misic et al. |
| 4,740,751 A | 4/1988 | Misic et al. |
| 4,764,726 A | 8/1988 | Misic et al. |
| 4,793,356 A | 12/1988 | Misic et al. |
| 4,797,617 A | 1/1989 | Misic et al. |
| 4,825,162 A | 4/1989 | Roemer et al. |
| 4,839,594 A | 6/1989 | Misic et al. |
| 4,841,248 A | 6/1989 | Mehdizadeh |
| 4,879,516 A | 11/1989 | Mehdizadeh et al. |
| 4,881,034 A | 11/1989 | Kaufman et al. |
| 4,920,318 A | 4/1990 | Misic et al. |
| 4,975,644 A | 12/1990 | Fox |
| 5,136,244 A | 8/1992 | Jones et al. |
| 5,196,796 A | 3/1993 | Misic et al. |
| 5,209,233 A | 5/1993 | Holland et al. |
| 5,256,971 A | 10/1993 | Boskamp |
| 5,258,717 A | 11/1993 | Misic et al. |
| 5,315,251 A | 5/1994 | Derby |

(List continued on next page.)

OTHER PUBLICATIONS

Lin, et al., (1998), Magnetic Resonance in Medicine, "A Novel Multi–segment Surface Coil for Neuro–Functional Magnetic Resonance Imaging," vol. 39, pp. 164–168.

Meyer, et al., (1995), Journal of Magnetic Resonance, Series B, "A 3×3 Mesh Two–Dimensional Ladder Network Resonator of MRI of the Human Head," vol. 107, pp. 19–24.

Roemer, et al., (1990), Magnetic Resonance in Medicine, "The NMR Phase Array," vol. 16, pp. 192–225.

Primary Examiner—Louis M. Arana
(74) Attorney, Agent, or Firm—James R. Stevenson; Gregory L. Bradley

(57) ABSTRACT

A coil interface allows a neurovascular coil system to be coupled to a magnetic resonance (MR) system. The neurovascular coil system has an array of coils including a birdcage coil, at least one spine coil, and at least one neck coil, with the MR system being equipped with a number of receivers. The coil interface includes a plurality of input ports, a plurality of output ports, and an interface circuit. The plurality of input ports are for coupling to the coils of the neruovascular coil system, and the plurality of output ports for coupling to the receivers of the MR system. The interface circuit enables the input ports and the output ports to be selectively interconnected, and thereby enables the neurovascular coil system to be selectively operated in (I) a neurovascular mode; (II) a high resolution brain mode; (III) a high speed brain mode; (IV) a high resolution brain and c-spine mode; (V) a cervical spine mode; and (VI) a volume neck mode.

45 Claims, 9 Drawing Sheets

U.S. PATENT DOCUMENTS

| | | |
|---|---|---|
| 5,348,010 A | 9/1994 | Schnall et al. |
| 5,355,087 A | 10/1994 | Claiborne et al. |
| 5,517,120 A | 5/1996 | Misic et al. |
| 5,521,506 A | 5/1996 | Misic et al. |
| 5,602,479 A | 2/1997 | Srinivasan et al. |
| 5,610,520 A | 3/1997 | Misic |
| 5,998,999 A | 12/1999 | Richard et al. |
| 6,040,697 A | 3/2000 | Misic |
| 6,051,974 A | 4/2000 | Reisker et al. |
| 6,100,691 A | 8/2000 | Yeung |
| 6,177,797 B1 | 1/2001 | Srinivasan |
| 6,223,065 B1 | 4/2001 | Misic et al. |
| 6,323,648 B1 * | 11/2001 | Belt et al. .................... 324/322 |
| 6,356,081 B1 * | 3/2002 | Misic ......................... 324/318 |

\* cited by examiner

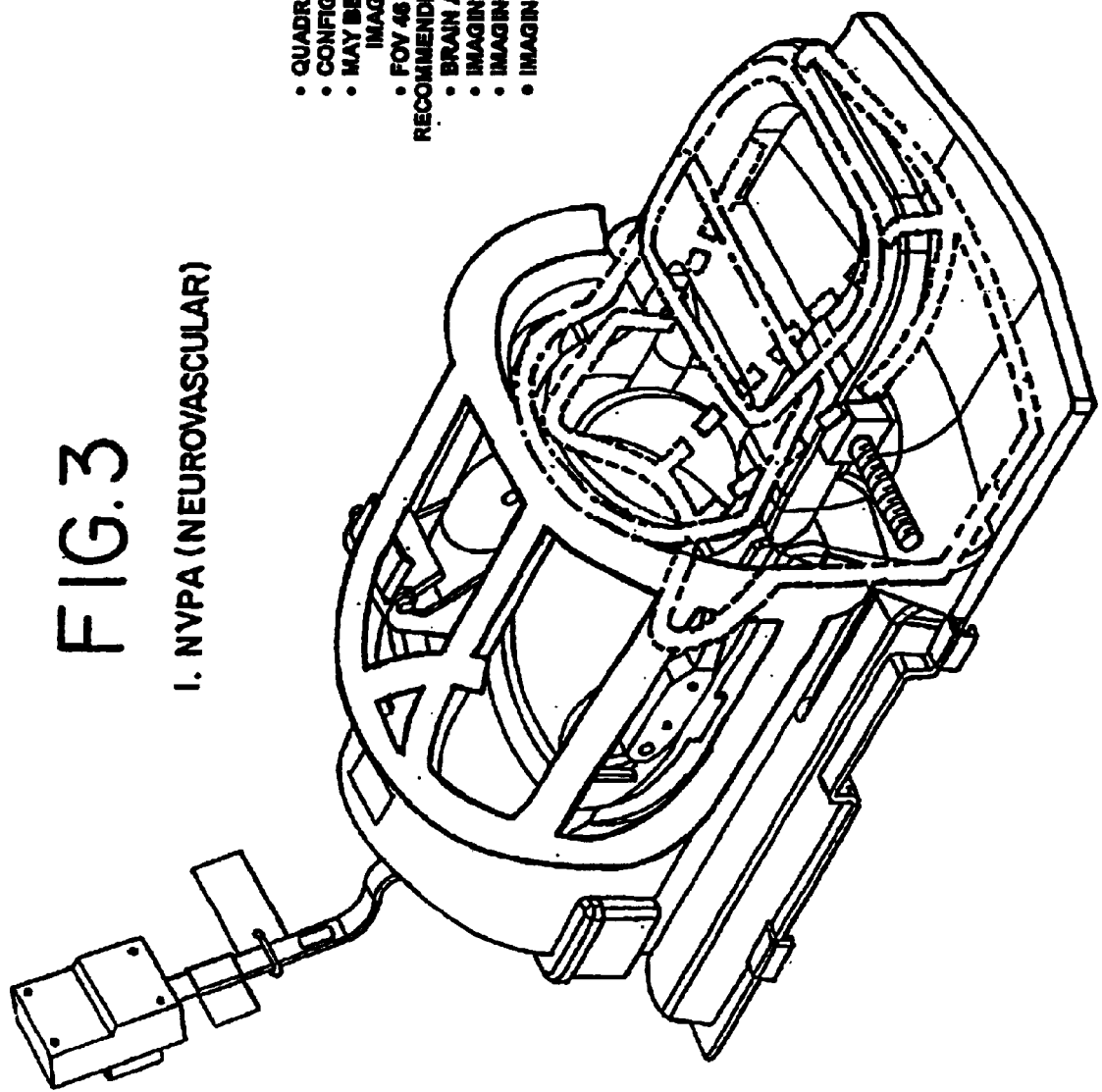

2. HRBRN (HIGH RESOLUTION BRAIN ARRAY)

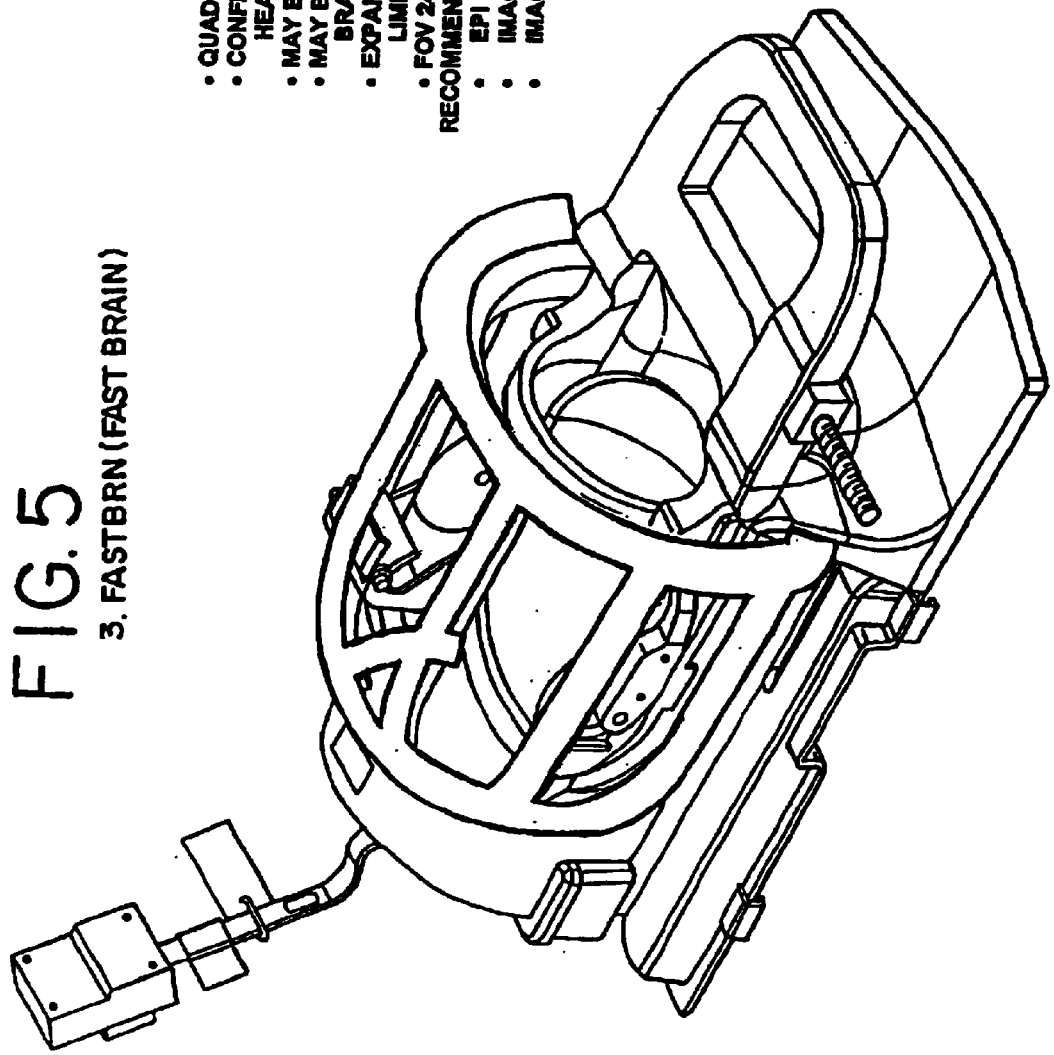

FIG. 6

4. HRBRNCS (HIGH RESOLUTION BRAIN AND C-SPINE MODE)

- QUADRATURE/PHASED ARRAY MODE
- CONFIGURATION FILE WILL TURN ON ONLY THE HEAD AND C-SPINE COILS OF THE ARRAY
- USE CONFIGURATION WHEN IMAGING THE BRAIN AND THE C-SPINE AT HIGH RESOLUTION
- COMPATIBLE WITH ALL IMAGING SEQUENCES ON MANY MRI SYSTEMS
- FOV 46 CM

RECOMMENDED USES

- HIGH RESOLUTION IMAGING OF BRAIN AND CIRCLE OF WILLIS
- HIGH RESOLUTION OF SPINAL CORD AND CERVICAL SPINE
- HIGH RESOLUTION IMAGING OF BRAIN STEM

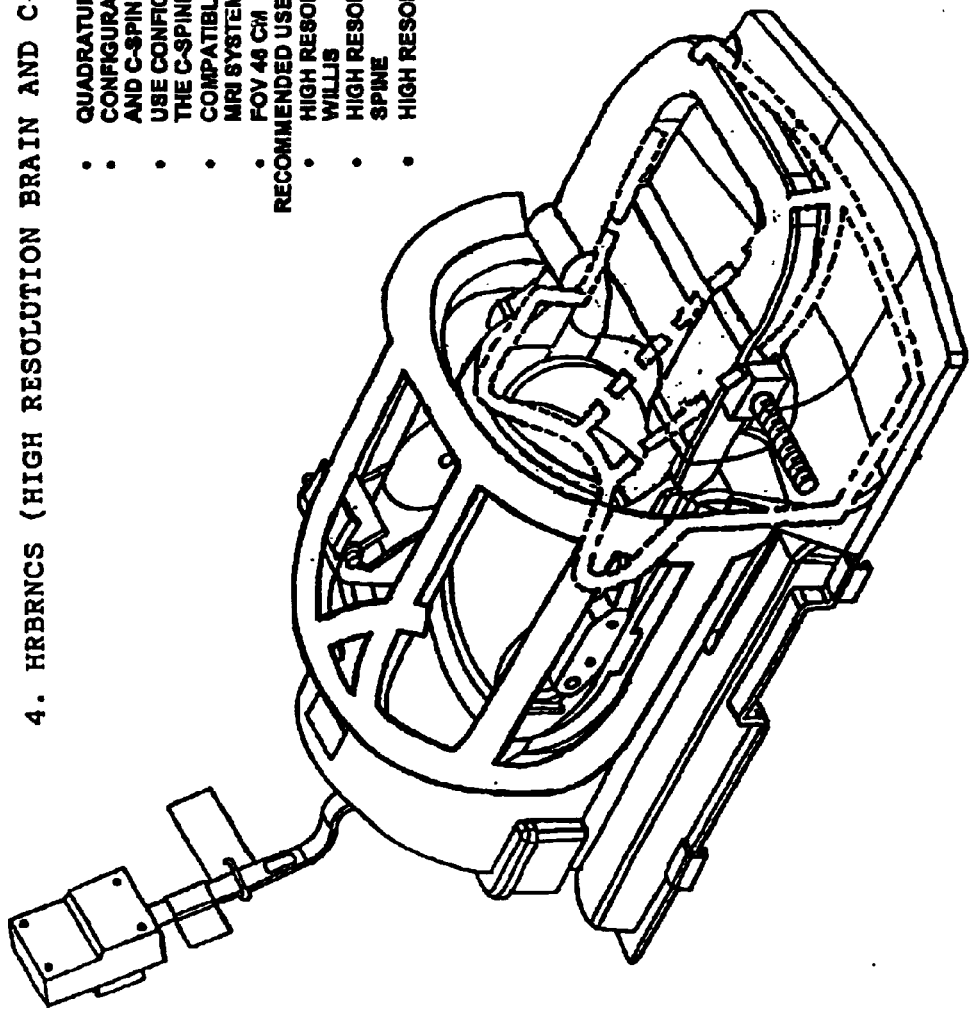

5. CSPINE (CERVICAL SPINE MODE)

- CONFIGURATION FILE WILL TURN ON ONLY THE C-SPINE COIL ELEMENTS OF THE ARRAY
- USE CONFIGURATION WHEN IMAGING THE CERVICAL SPINE AT HIGH RESOLUTION
- COMPATIBLE WITH ALL IMAGING SEQUENCES ON MANY MRI SYSTEMS
- FOV 22 CM

RECOMMENDED USES:
- HIGH RESOLUTION IMAGES OF SPINAL CORD AND CERVICAL SPINE

6. NECK (VOLUME NECK MODE)

- CONFIGURATION FILE WILL TURN ON ONLY THE C-SPINE AND NECK COILS OF THE ARRAY (OTHER CONFIGURATIONS POSSIBLE)
- USE FOR C-SPINE, CAROTID ARTERIES AND ALL NECK IMAGING
- COMPATIBLE WITH ALL IMAGING SEQUENCES ON MANY MRI SYSTEMS
- FOV 28 CM

RECOMMENDED USES:
- IMAGING OF THE NECK
- IMAGING OF THE CERVICAL SPINE

NEUROVASCULAR COIL SYSTEM AND INTERFACE AND SYSTEM THEREFOR AND METHOD OF OPERATING SAME IN A MULTITUDE OF MODES

CROSS-REFERENCE TO RELATED APPLICATION(S)

This application is a continuation-in-part of Ser. No. 10/082,818 filed on. Feb. 25, 2002 which is a continuation of Ser. No. 09/449,255 filed Nov. 24, 1999 now P.N. 6356,081.

The invention described in this patent application is closely related to the following copending application for patent: U.S. Ser. No. 10/082,818, titled MULTIMODE OPERATION OF QUADRATURE PHASED ARRAY MR COIL SYSTEMS, filed Feb. 25, 2002, the contents of which are incorporated herein by reference. It also is related to U.S. Ser. No. 09/449,255, titled MULTIMODE OPERATION OF QUADRATURE PHASED ARRAY MR COIL SYSTEMS, filed Nov. 24, 1999, which was granted as U.S. Pat. No. 6,356,081 on Mar. 12, 2002. The present application, and the above cited parent applications on which it is based, all claim the benefit of U.S. Provisional Application No. 60/109,820, filed Nov. 25, 1998.

BACKGROUND OF THE INVENTION

The advantages of using phased array or multi-coil magnetic resonance (MR) coil systems to enhance magnetic resonance imaging and spectroscopy are well known. A situation facing the designer of such coils is the finite number of available simultaneous data acquisition channels in the host magnetic resonance imaging (MRI) system. Frequently, there are only four such channels, often referred to as receivers, available in the host MRI system.

Another issue is the time it takes to reconstruct the images from the collected data. Processing multiple channels to form a single image increases the time needed by the MRI system to process the data, by two or three dimensional Fourier Transform techniques or other methods, and ultimately create the final images. Another consideration is that data acquisition hardware with additional performance capabilities may be available only on one receiver, or at least on fewer than the total number of available receivers.

Reconstruction of an image from two quadrature modes of a specific phased array coil element via two separate data acquisition channels provides the best possible image signal-to-noise ratio and uniformity, as the data can always be reconstructed in the most optimum way in such a scenario. However, the use of two separate receivers for the two quadrature signals from a specific phased array coil element may cause problems with reconstruction time, or limitations due to the finite number of available receivers. Thus, there may be conditions when combining the two quadrature signals at the radio frequency (RF) level into a single signal may be most advantageous, and other times when processing the two RF signals independently via two separate data acquisition receivers may be the best scheme.

OBJECTIVES OF THE INVENTION

It is, therefore, an objective of the invention to provide a coil interface that, when interconnected between a phased array coil and a host MRI system, allows the multiple outputs of the coil elements of the phased array coil to be selectively interconnected to one or more receiver channels of the host MRI system.

A further objective of the invention is to provide a coil interface that allows the two quadrature magnetic resonance (MR) signals from one or more coil elements to be processed and conveyed either as distinct signals to two separate receivers of the host MRI system or as a single RF combined signal to one receiver of the MRI system.

Another objective is to provide a coil interface that allows the mode of operation for the phased array coil to be remotely selected from the operator's console of the host MRI system.

It is another objective to provide a system and method of selectively interconnecting the multiple outputs of the coil elements of a phased array coil system to one or more receiver channels of a host MRI system.

In addition to the objectives and advantages listed above, various other objectives and advantages of the invention will become apparent to persons skilled in the relevant art from a reading of the detailed description and other sections of this document.

SUMMARY OF THE INVENTION

In a first aspect, the invention provides a coil interface for coupling a neurovascular coil system to a magnetic resonance (MR) system. The neurovascular coil system has an array of coils including a birdcage coil, at least one spine coil, and at least one neck coil, with the MR system being equipped with a number of receivers. The coil interface includes a plurality of input ports, a plurality of output ports, and an interface circuit. The plurality of input ports are for coupling to the coils of the neurovascular coil system, and the plurality of output ports for coupling to the receivers of the MR system. The interface circuit enables the input ports and the output ports to be selectively interconnected, and thereby enables the neurovascular coil system to be selectively operated in (I) a neurovascular mode; (II) a high resolution brain mode; (III) a high speed brain mode; (IV) a high resolution brain and c-spine mode; (V) a cervical spine mode; and (VI) a volume neck mode.

In a related aspect, the invention provides a neurovascular coil system for coupling to a magnetic resonance (MR) system, with the MR system being equipped with a number of receivers. The neurovascular coil system includes an array of coils, a plurality of input ports, a plurality of output ports, and an interface circuit. The array of coils includes a birdcage coil, at least one spine coil, and at least one neck coil. The birdcage coil is connected to at least one of the input ports. The at least one spine coil is connected to at least one of the input ports, and the at least one neck coil is connected to at least one of the input ports. The plurality of output ports are for coupling to the receivers of the MR system. The interface circuit enables the input ports and the output ports to be selectively interconnected, and thereby enables the neurovascular coil system to be selectively operated in (I) a neurovascular mode; (II) a high resolution brain mode; (III) a high speed brain mode; (IV) a high resolution brain and c-spine mode; (V) a cervical spine mode; and (VI) a volume neck mode.

In another related aspect, the invention provides a method of operating a neurovascular coil system with a magnetic resonance (MR) system. The method includes the steps of: providing a plurality of input ports for coupling to the coils of the neurovascular coil system; providing a plurality of output ports for coupling to the receivers of the MR system; and selectively interconnecting the input ports and the output ports, and thereby enable the neurovascular coil system to be selectively operated in (I) a neurovascular mode; (II) a high resolution brain mode; (III) a high speed brain mode; (IV) a high resolution brain and c-spine mode; (V) a cervical spine mode; and (VI) a volume neck mode.

In another related aspect, the invention provides a magnetic resonance (MR) system. The MR system includes a number of receivers and a neurovascular coil system, with the neurovascular coil system being operably connectable to other components of the MR system. The neurovascular coil system includes an array of coils, a plurality of input ports, a plurality of output ports, and an interface circuit. The array of coils includes a birdcage coil, at least one spine coil, and at least one neck coil. The birdcage coil is connected to at least one of the input ports. The at least one spine coil is connected to at least one of the input ports, and the at least one neck coil is connected to at least one of the input ports. The plurality of output ports are for coupling to the receivers of the MR system. The interface circuit enables the input ports and the output ports to be selectively interconnected, and thereby enables the neurovascular coil system to be selectively operated via the MR system in (I) a neurovascular mode; (II) a high resolution brain mode; (III) a high speed brain mode; (IV) a high resolution brain and c-spine mode; (V) a cervical spine mode; and (VI) a volume neck mode.

BRIEF DESCRIPTION OF THE DRAWINGS

The present invention, and the various modes of operation it allows for a phased array neurovascular coil, is illustrated by way of example, and not limitation, in the figures of the accompanying drawings, in which:

FIG. 3 illustrates the phased array neurovascular coil in a first operational mode;

FIG. 5 illustrates the phased array neurovascular coil in a third operational mode;

FIG. 6 depicts the phased array neurovascular coil in a fourth operational mode;

DESCRIPTION OF THE PREFERRED EMBODIMENTS

The invention will now be described with reference to the drawings, in which like elements are referred to by like numerals. In particular, the multimode operation of a neurovascular coil designed for the General Electric Medical Systems (GEMS) Signa® MRI system is described. The embodiments, however, may be applied to other coils and other MRI systems by those of ordinary skill in the art after reviewing this detailed description and the accompanying figures.

Figure 1:
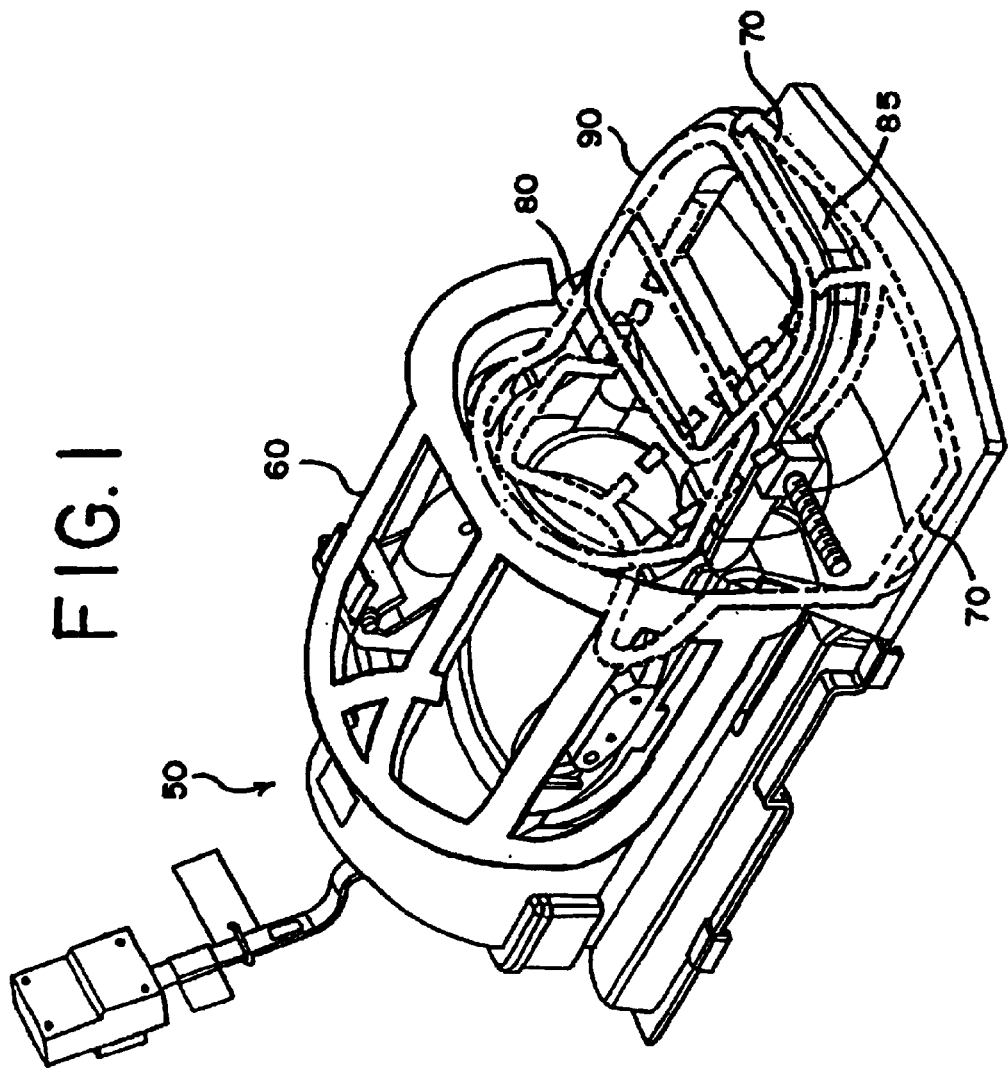
FIG. 1 illustrates a phased array neurovascular coil.

FIG. 1 illustrates a phased array neurovascular coil 50, also referred to herein as a neurovascular array. The neurovascular array 50 basically contains four separate imaging coils. The first coil is a tapered birdcage resonator 60 that is capable of providing quadrature coverage of the brain and head. Further details regarding the quadrature tapered birdcage are provided in U.S. application Ser. No. 09/449,256, filed Nov. 24, 1999, now issued as U.S. Pat. No. 6,344,745, the contents of which are incorporated herein by reference. The first coil may alternatively be in the form of a domed birdcage, such as is described in U.S. Pat. No. 5,602,479, the contents of which are also incorporated herein by reference. The tapered birdcage is preferred, however, because it provides improved field homogeneity on the XZ and YZ image planes.

The second coil of neurovascular array 50 is formed from two posterior cervical spine (C-Spine) coils 70, the outputs of which can be either handled separately or combined at the radio frequency (RF) level, as is explained in detail below.

The third and fourth coils of neurovascular array 50 are a superior anterior neck coil 80 and an inferior anterior neck coil 90. Alternatively, a single anterior neck coil (not shown) may be used in lieu of the separate superior and inferior neck coils 80 and 90.

In accordance with a preferred embodiment, the superior anterior neck coil 80 and the inferior anterior neck coil 90 are mounted in an adjustable manner. For example, referring to FIG. 1, the neck coils 80 and 90 may be housed in a support structure 85, as is known to those skilled in the art. The support structure 85 is preferably mounted in a hinged manner, with the hinge being situated toward the superior end of support structure 85. When mounted in this fashion, the inferior end of support structure 85 may be raised and lowered, depending upon the size of the test subject, and may rest on the chest area of the test subject. This provides the advantage of locating the neck coils 80 and 90 as close to the test subject as possible, thereby improving image quality over embodiments in which the neck coils 80 and 90 are fixedly located.

Figure 2A:
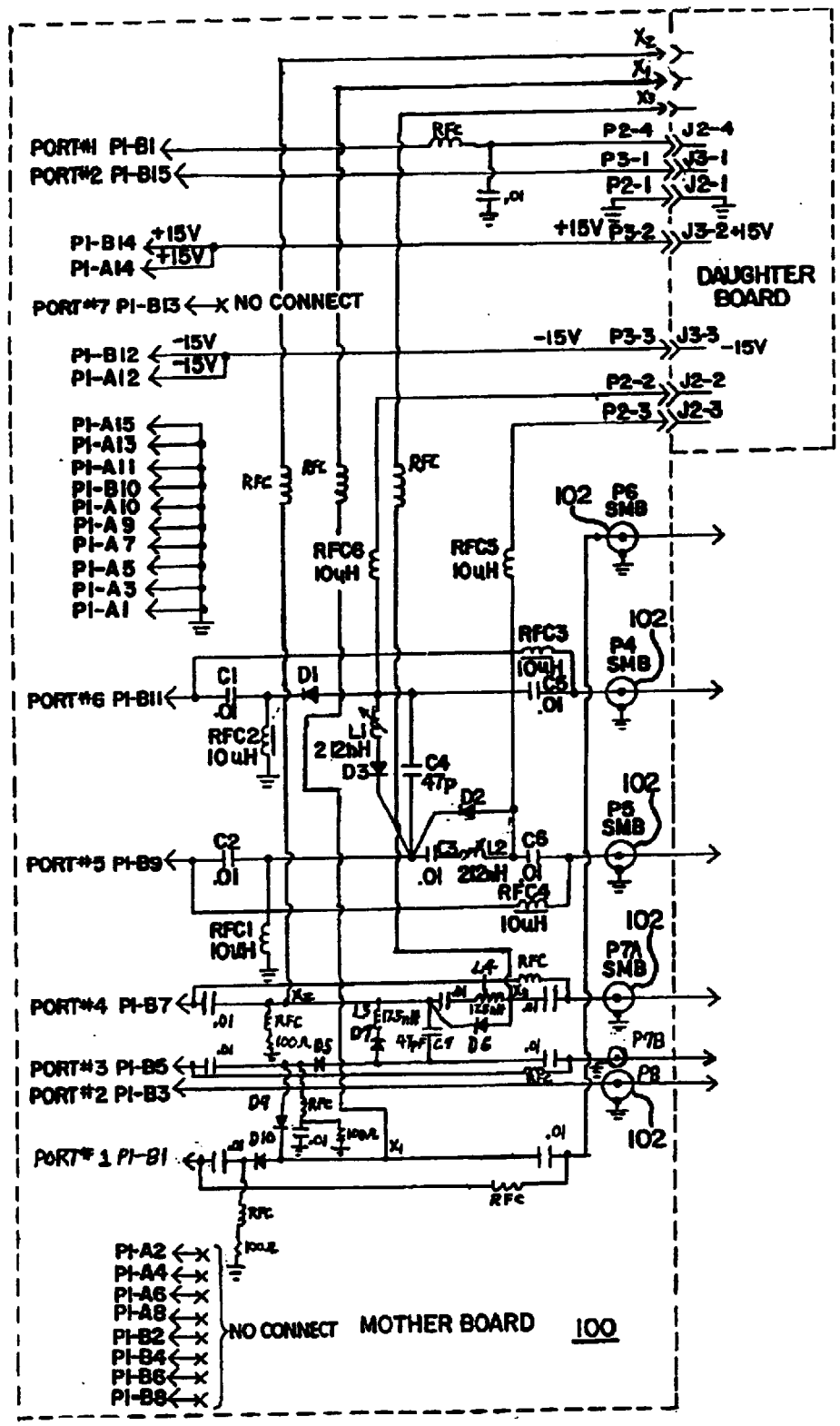
FIGS. 2A and 2B are electrical schematics of a coil interface circuit that provides multimode operation of the phased array neurovascular coil shown in FIG. 1.
Figure 2B:
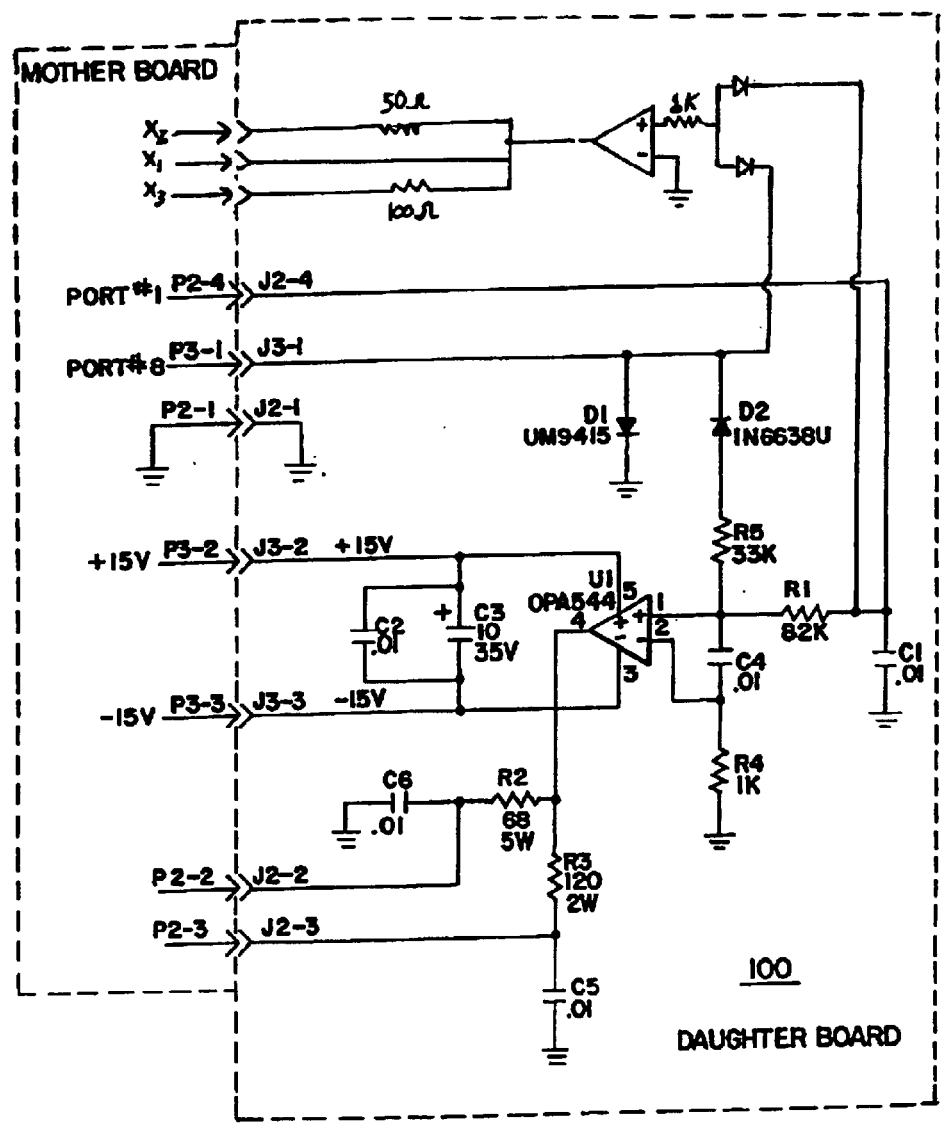

FIGS. 2A and 2B illustrate an electrical schematic of a preferred embodiment of the invention, namely, coil interface circuit 100. It provides multimode operation of the phased array neurovascular coil 50 shown in FIG. 1. The coil interface circuit 100 couples the phased array neurovascular coil 50 to a host MRI system, in particular the GEMS Signa® MRI system. The coil interface circuit 100 has a number of signal input ports 102, which are coupled to receive MR signals from the phased array neurovascular coil 50. As shown in FIG. 2A, the signal inputs 102 are electronically connected to the output ports (i.e., port #1, port #2, port #3, port #4, port #5, and port #6) which in turn are coupled to the predetermined receivers of the host MRI system.

As is well known in the art, however, many MRI systems, including the GEMS Signa® MRI system, provide only four receiver channels. Because the number of signal inputs 102 exceeds the number of available receiver channels, not all of the signal inputs 102 can be separately applied simultaneously to the host MRI system.

The coil interface circuit 100 of the present invention, however, allows selected signal inputs to be coupled to the receiver channels that are provided by the MRI system.

Selection of the operational modes of the phased array neurovascular coil 50 is made in coil interface 100 by the use of PIN diode RF switches, as further described below.

The following table defines the relationship between the signal inputs 102 of coil interface 100 and the output ports of the coil interface 100.

TABLE I

| COIL SIGNAL | INPUT PORT | OUTPUT PORT | MRI SYSTEM RECEIVER |
|---|---|---|---|
| Head I | P5 | 5 | 0 |
| Head Q (High Resolution) | P4 | 6 | 1 |
| Head Q (Fast Speed-Combined With Head I) | P4 | 5 | 0 |
| C-Spine-Left | P7A | 4 | 3 |
| C-Spine-Right (High Resolution) | P7B | 3 | 2 |
| C-Spine-Right (When Combined With Left) | P7B | 4 | 3 |
| ANT Neck-Superior | P6 | 3 or 1 | 2 or 0 |
| ANT Neck-Inferior | P8 | 2 | 1 |

In Table I above, Head I refers to the in-phase MR signal from birdcage coil 60, and Head Q refers to the quadrature MR signal from birdcage coil 60. C-Spine-Left refers to the left element of the posterior cervical spine coil 70, and C-Spine-Right refers to the right element of cervical spine coil 70. ANT Neck-Superior refers to the anterior neck coil 80 at the superior end of the neurovascular array 50, whereas ANT Neck-Inferior refers to the anterior neck coil 90 at the inferior end of neurovascular array 50.

As shown in FIGS. 2A and 2B, the coil interface 100 is coupled to a DC power supply, +15V and −15V, from the host MRI system. The electrical schematic of FIG. 2A also includes a number of inductors, each labeled as "RFC," that function as RF chokes. The RF chokes are preferably self-resonant at approximately 63.87 MHz. RF chokes of the type appropriate for use with the present invention may be obtained, for example, from J. W. Miller, Part No. RFC-50.

The birdcage coil 60 and coil interface 100 are designed so that the two quadrature signal components from the birdcage 60 may be selectively combined into a single signal. The combined signal can be then routed via one output port (e.g., port #5) of the interface 100 to a single receiver of the host MRI system, with the other receivers of the MRI system used to simultaneously acquire signals from the other coils of neurovascular array 50. This provides coverage of the entire volume within the neurovascular array 50 using all four of the data acquisition channels of the MRI system simultaneously. In this configuration, by combining the two quadrature signal components from birdcage coil 60, the coil interface 100 allows the invention to be used for applications employing a single FAST receiver, where only one of the available phased array receivers has the FAST data acquisition capability.

When the brain alone or the brain, brain stem and cervical region of the spinal cord together, for example, are to be imaged with the highest possible image signal-to-noise ratio and uniformity, another configuration may be used. Specifically, the coil interface 100 can direct the two quadrature components of the MR signal from the tapered birdcage coil element 60 into two separate receivers for optimum results. An advantage of this feature is that it preserves the ability to simultaneously cover the entire region from the aortic arch to the top of the head in one phased array acquisition. It still, however, allows the use of one high performance receiver channel for complete acquisition of images from the brain. It enables the highest degrees of resolution, of signal-to-noise ratio and of uniformity to be obtained from the brain, and associated neurological areas of interest, by acquiring the data from the two quadrature modes of the tapered birdcage coil element 60 through two separate receivers.

The coil interface 100 supports distinct imaging functions by automatic selection of the optimum assembly of the array coil elements. As described below, the coil interface 100 may be remotely configured, i.e., the state of one or more PIN diode RF switches may be set based upon inputs from the operator's console of the MRI system. Examples of the distinct imaging modes that may be supported by an interface, such as the coil interface 100 shown in FIGS. 2A and 2B, include: NEUROVASCULAR, HIGH RESOLUTION BRAIN, HIGH SPEED BRAIN, HIGH RESOLUTION BRAIN AND CERVICAL SPINE, CERVICAL SPINE, and VOLUME NECK.

Each of these modes is preferably activated by selecting the appropriate item from the menu of operational modes on the console of the host MRI system when prescribing the scan. By way of the coil interface 100, the needed coils and the signal combining method are activated for the selected mode, and the unused coil elements are electronically disabled to optimize image quality and minimize artifacts. Each mode has a distinct method of operation as described below.

Neurovascular Mode

In the NEUROVASCULAR mode, all of the coil elements in neurovascular array 50 are active, with the birdcage coil 60 in particular operating in quadrature with its two signals combined to drive a single receiver. To do this, the coil interface 100 has a combiner circuit for birdcage coil 60. It includes one or more remotely operable switches and a 90 degree phase shifting circuit. Referring to FIG. 2A, the combiner circuit is located generally between the P4 and P5 signal inputs (or input ports) 102 and the #5 and #6 output ports. Its 90 degree phase shifting circuitry includes inductor L2 and capacitor C4, and its switches include PIN diodes D1, D2 and D3.

When coil interface 100 is operated in the NEUROVASCULAR mode, the MRI system sets the combiner circuit to combine the in-phase ("I") and quadrature ("Q") signals output by birdcage coil 60 (when the MRI system is operating in the acquisition state). It does so by biasing off PIN diodes D1, D2 and D3. With these diodes in the off state, the I signal is conveyed from the P5 signal input 102 through inductor L2 where it is combined with the Q signal conveyed from the P4 signal input 102 through capacitor C4. This is made possible in part by PIN diode D1, which blocks the Q signal from output port #6. The combined signal is thus effectively phase-shifted by approximately 90 degrees, as L2 imposes a 45° delay on the I signal and C4 imposes a 45° delay on the Q signal. It is ultimately routed to output port #5 where it is made available to the MRI system (e.g., to receiver "0" in Table I above).

The two posterior C-Spine coils 70 likewise have their signals combined by a combiner circuit, with the combined signal being applied through a single output port (e.g., port #4) to drive a single receiver (e.g., receiver "3" in Table I above). Like its counterpart for birdcage coil 60, the combiner circuit for C-Spine coils 70 features remotely operable switches and a 90 degree phase shifting circuit. As shown in FIG. 2A, the combiner circuit is located generally between the P7A and P7B input ports 102 and the #4 and #3 output ports. Its 90 degree phase shifting circuitry includes inductor L4 and capacitor C7, and its switches include PIN diodes D5, D6 and D7.

The superior and inferior anterior neck coils 80 and 90, however, each drive a separate receiver (e.g., receivers "2" and "1," respectively) through separate output ports (e.g., ports #3 and #2, respectively). The signal from superior neck coil 80 is preferably routed from output port #3 in this instance, rather than from output port #1, by appropriate biasing of the switches (e.g., PIN diodes D9 and D110) within the circuitry that controls and/or interconnects those output ports. Thus, in the NEUROVASCULAR mode, the coil interface 100 provides four simultaneous data acquisitions, the maximum number of data acquisitions that can be simultaneously handled by a four-receiver host MRI system. Because the coverage volume is large, the signal-to-noise ratio performance of the head coil of array 50 may be slightly reduced. This is due to the combination of the I and Q signals of birdcage coil 60, which permits one receiver channel to be used to cover the head region.

FIG. 3 is a wire model of the phased array neurovascular coil 50 in the NEUROVASCULAR mode. As noted above and shown in FIG. 3, all elements of the neurovascular array 50 are activated and the host MRI system operates in the phased array mode. The NEUROVASCULAR mode may essentially be used for all types of brain and neck imaging. The NEUROVASCULAR mode is particularly useful for brain and/or cervical spine localizers, imaging of the cervical spine, imaging of the carotid arteries, and imaging of the aortic arch. As illustrated in FIG. 3, this mode of operation advantageously provides a field of view of up to 46 cm.

High Resolution Brain Mode

In the HIGH RESOLUTION BRAIN mode, the two quadrature components of the MR signal from birdcage coil 60 each drive a separate receiver channel on the MRI system, providing optimum uniformity and signal-to-noise ratio performance. Specifically, the MRI system sets the combiner circuit to separate the in-phase ("I") and quadrature ("Q") signals output by birdcage coil 60 (when the MRI system is operating in the acquisition state). It does so by biasing on PIN diodes D1, D2 and D3. With diode D2 in the on state, the I signal is conveyed from the P5 signal input 102 through diode D2, effectively bypassing inductor L2 and capacitor C3. The I signal is ultimately routed to output port #5 where it is made available to the MRI system (e.g., receiver "0" in Table I above). With diode D3 in the conducting state, inductor L1 and capacitor C4 form a parallel resonant circuit whose high impedance effectively mimics an open-circuit. The Q signal is conveyed from the P4 signal input 102 through diode D1 to output port #6 where it is made available to the MRI system (e.g., receiver "1" in Table I above). The combiner circuit for birdcage coil 60 thus electrically disconnected to allow independent reconstruction of the data obtained from head coil 60 via the two receiver channels of the host MRI system.

The birdcage resonator 60 is the only coil element active in the HIGH RESOLUTION BRAIN mode. The posterior C-Spine coils 70 and the anterior neck coils 80 and 90 are electrically disabled to minimize artifacts and undesirable coil interactions. Because the highest possible degree of signal-to-noise ratio and uniformity are desired, but coverage of the entire volume of neurovascular array 50 is not needed, two separate receivers are used for the MR signals of birdcage coil 60. Techniques for electrically disabling an imaging coil are well known to those skilled in the art.

Figure 4:
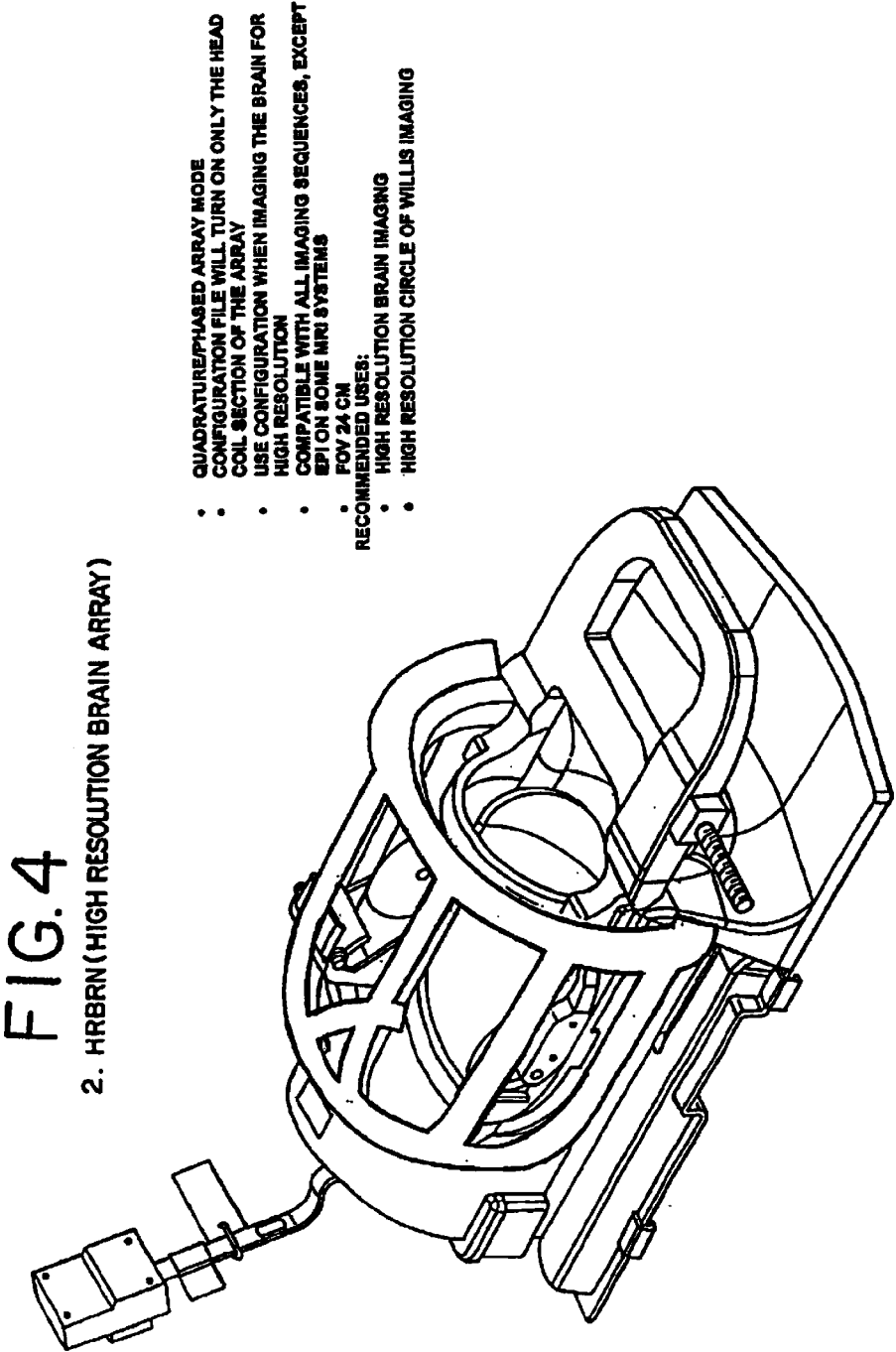
FIG. 4 shows the phased array neurovascular coil in a second operational mode.
Figure 7:
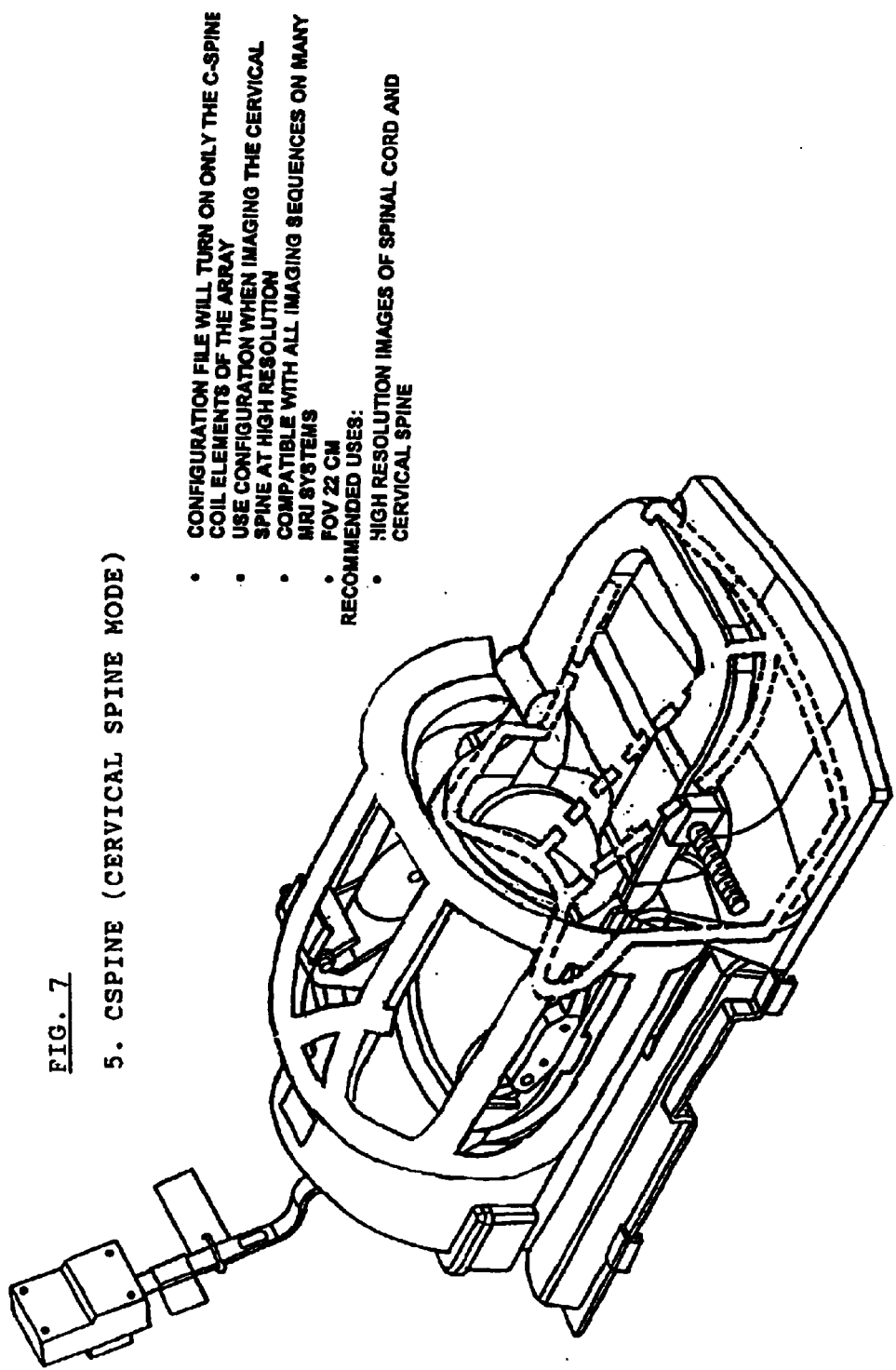
FIG. 7 shows the phased array neurovascular coil in a fifth operational mode.
Figure 8:
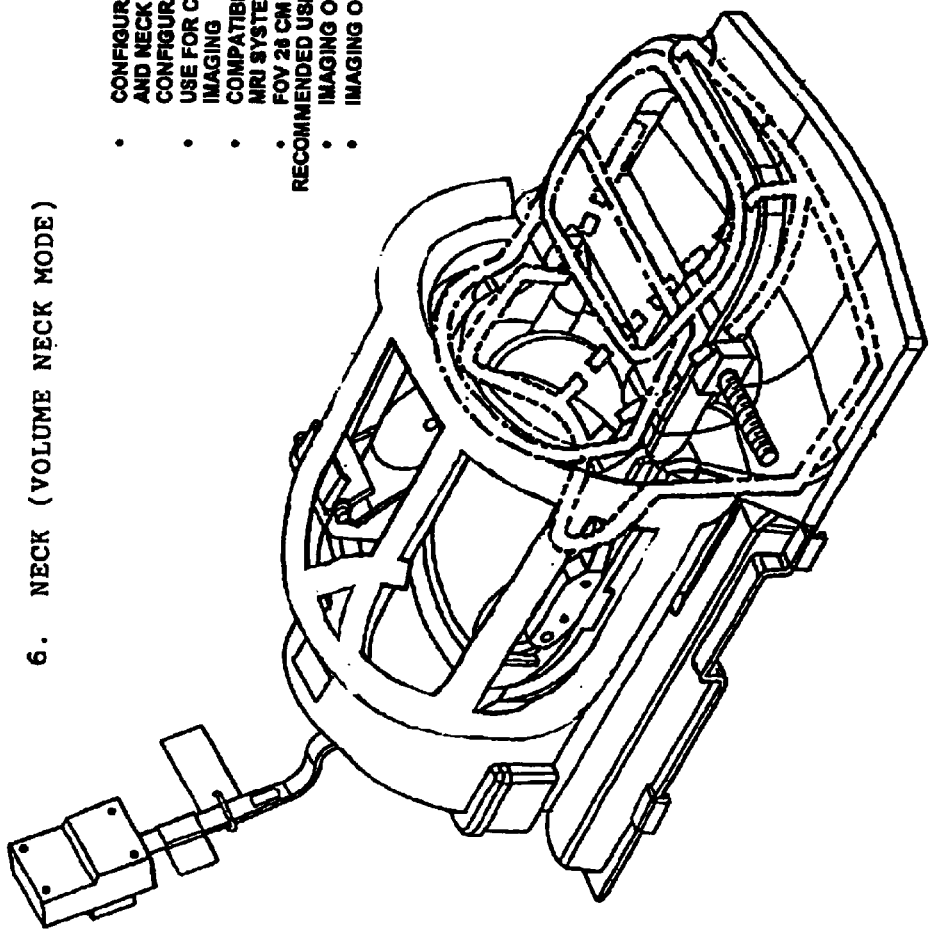
FIG. 8 illustrates the phased array neurovascular coil in a sixth operational mode.

FIG. 4 is a wire model of the phased array neurovascular coil 50 in the HIGH RESOLUTION BRAIN imaging mode. As noted above and shown in FIG. 4, only the quadrature birdcage coil 60 is activated when the neurovascular array 50 is operated in this particular mode. The HIGH RESOLUTION BRAIN imaging mode may be used essentially for all types of brain and/or head imaging, but is especially useful for high resolution studies of the brain. The HIGH RESOLUTION BRAIN imaging mode is also useful for high resolution imaging of the Circle of Willis. As illustrated in FIG. 4, this mode of operation provides a field of view of up to 24 cm.

High Speed Brain Mode

The HIGH SPEED BRAIN mode routes the two quadrature signals of birdcage resonator 60 through its corresponding combiner circuit in coil interface 100 to produce one signal containing both the "I" and "Q" signal components. In the manner described above with reference to FIG. 2A, the combiner circuit for birdcage coil 60 produces the combined signal at a single output port (e.g., port #5). The combined signal drives one channel of the phased array system, preferably receiver "0" of the GEMS Signa® MRI system (called receiver "1" on the manual pre-scan page of the LX system). This not only minimizes reconstruction time but also may allow the use of a single FAST receiver. All of the other coil elements are electrically disabled.

FIG. 5 is a wire model of the phased array neurovascular coil 50 in the HIGH SPEED BRAIN mode. Like FIG. 4, only the birdcage coil 60 is activated; the cervical spine coils 70 and the anterior neck coils 80 and 90 being electrically disabled. The HIGH SPEED BRAIN mode may be used for Echo Planar Imaging and/or vascular or other studies of the brain where decreased acquisition time is desirable. The HIGH SPEED BRAIN mode is also useful for imaging the Circle of Willis. This particular mode of operation can provide a field of view of up to 24 cm.

Additional modes of operation for the phased array neurovascular coil 50 can be realized by providing the host MRI system with the appropriate port masks for coil interface 100. For example, the phased array neurovascular coil 50 may also acquire images from one or more of the following operational modes: HIGH RESOLUTION BRAIN AND CERVICAL SPINE, CERVICAL SPINE and VOLUME NECK. Each of these modes of operation is described in further detail below.

High Resolution Brain and Cervical Spine Mode

In the HIGH RESOLUTION BRAIN AND C-SPINE mode, the coil interface 100 is set by the host MRI system so that the birdcage and posterior C-Spine coils 60 and 70 are activated, and the anterior neck coils 80 and 90 are disabled. This allows focal studies of the brain, brain stem, spinal cord, and cervical spine. Specifically, the coil interface 100 couples the I and Q MR signals from birdcage coil 60 to separate output ports (e.g., ports #5 and #6), which are conveyed to separate receivers on the MRI system (e.g., receivers "0" and "1"), as shown in FIG. 2A and Table I above. As described for the HIGH RESOLUTION BRAIN mode above, the combiner circuit for birdcage coil 60 is electrically disconnected to allow independent reconstruction of the data obtained from head coil 60 via the two receiver channels of the host MRI system.

The left and right posterior C-Spine coils 70 also each drive a separate channel. Specifically, the MRI system sets the combiner circuit of the C-Spine coils to separate the MR signals detected by the two coil elements. It does so by biasing on PIN diodes D5, D6 and D7. With diode D6 in the on state, the MR signal from the left spine coil element is conveyed from the P7A signal input 102 through diode D6, effectively bypassing inductor L4 and its neighboring capacitor. This MR signal is ultimately routed to output port #4 where it is made available to the MRI system (e.g., receiver "3" in Table I above). With diode D7 in the conducting state, inductor L3 and capacitor C7 form a parallel resonant circuit whose high impedance yields an open-circuit. The MR signal from the right spine coil element is thus conveyed from the P7B signal input 102 through diode D5 to output port #3 where it is made available to the MRI system (e.g., receiver "2" in Table I above). Being disconnected, this combiner circuit thus allows independent reconstruction of the data obtained from the spine coil elements 70 via the two receiver channels of the host MRI system.

In the HIGH RESOLUTION BRAIN AND C-SPINE mode, the birdcage and C-Spine coils 60 and 70 provide optimum uniformity and signal-to-noise ratio performance.

Cervical Spine Mode

In the CERVICAL SPINE mode, the two quadrature components of the MR signal from the left and right posterior C-Spine coil elements 70 each drive a separate receiver channel for optimum uniformity and signal-to-noise ratio performance. As described above for the previously articulated mode, the MR signals from the two C-Spine coils 70 may be applied via output ports #4 and #3 to receivers "3" and "2," respectively, of the host MRI system, as shown in Table I above. The combiner circuit for the C-Spine coils, as shown in FIG. 2A, is thus electrically disconnected to allow independent reconstruction of the data delivered to the "3" and "2" receiver channels of the MRI system. The head coil element 60 and the anterior neck coils 80 and 90 are electrically disabled to minimize artifacts and undesirable coil interactions.

Volume Neck Mode

This mode disables the birdcage coil 60 that covers the head region, and activates the spine region coils to form a volume acquisition of the neck region. In a preferred configuration, the coil interface 100 is set so that both the left and right C-Spine coils 70 are activated, as are the superior and inferior neck coils 80 and 90. Specifically, as described above for the two previously articulated modes, the coil interface 100 couples the MR signals from the two C-Spine coils 70 to separate output ports (e.g., ports #4 and #3), which are conveyed to separate receivers on the MRI system (e.g., receivers "3" and "2"), as shown in Table I above. The superior and inferior neck coils 80 and 90 also drive separate receivers (e.g., receivers "0" and "1," respectively) through separate output ports (e.g., ports #1 and #2, respectively). The signal from superior neck coil 80 is routed from output port #1 in this instance rather than from output port #3, as the latter is being used to route the MR signal from right C-Spine coil 70 to receiver "2" of the host MRI system. The routing, of course, is carried out by the host MRI system by biasing the appropriate switches (e.g., PIN diodes D9 and D10) within the circuitry of the affected output ports. This preferred configuration provides optimum uniformity and signal-to-noise ratio performance.

In a first alternative configuration, the coil interface 100 is again set so that both the left and right C-Spine coils 70 are activated, as are the superior and inferior neck coils 80 and 90. The combiner circuit for the C-Spine coils, however, is used to combine the two C-spine signals, as in the NEUROVASCULAR mode. The combined signal is thus applied through one output port (e.g., port #4) to one channel (e.g., receiver "3") of the MRI system. The superior and inferior neck coils 80 and 90 still drive separate receivers, with the former driving receiver "2" through output port #3 and the latter driving receiver "1" through output port #2. Besides offering faster reconstruction time for C-Spine images, another difference between the preferred and alternative configurations is that the coil interface 100 is commanded to route the MR signal from the superior neck coil 80 from output port #3 in this instance rather than from output port #1.

In a second alternative configuration, the combiner circuit for the C-Spine coils 70 is still used to combine the two C-spine signals into one combined signal. It is applied through a single output port (e.g., port #4) to one channel (e.g., receiver "3"). In addition, the superior neck coil 80 still drives one receiver (e.g., receiver "2") through one output port (e.g., port #3). The inferior neck coil 90, however, is disabled.

In a third alternative configuration, the combiner circuit for the C-Spine coils 70 is still used to combine the two C-spine signals and to apply the combined signal through a single output port (e.g., port #4) to one receiver (e.g., "3"). For this configuration, however, the coil interface 100 is commanded to activate the inferior neck coil 90, not superior neck coil 80. The inferior neck coil 90 drives one receiver (e.g., receiver "1") through one output port (e.g., port #2). The superior neck coil 80 is disabled.

As described above, selection of the modes is made in the coil interface 100 by the use of PIN diode RF switches as illustrated in FIG. 2A. For birdcage coil 60, for example, the PIN diode switches either direct the two quadrature signals from birdcage coil 60 to two separate MRI receivers, or combine them with a relative phase difference of 90 degrees and direct them to a single receiver in the host MRI system. The same applies for the combiner circuit for the posterior C-Spine coil elements 70. Determination of which mode to support is made via detection of the bias pattern of the ports in the host GEMS Signa® MRI system. As will be apparent to those skilled in the art, the electrical length of the path that the various MR signals take through coil interface 100 should be designed to ensure that the MR signals may be properly combined by the MRI system. For example, the electrical lengths of the paths through the coil interface 100 may be adjusted to be an integer multiple of half wavelengths.

In view of the wide variety of modes in which the present invention can be operated, it should be understood that the presently preferred embodiment as illustrated in FIGS. 2A and 2B is exemplary only, and should not be taken as limiting the scope of the present invention. For example, more or fewer coil elements may be used than those described, or the steps of the method claimed below may be taken in sequences other than those described. In addition, although reference is made herein to the GEMS Signa® MRI system, other MRI systems having similar capabilities may alternatively be used to receive and process signals from the coils and interface described above.

I claim:

1. A coil interface for coupling a neurovascular coil system to a magnetic resonance (MR) system; said neurovascular coil system having an array of coils including a birdcage coil, at least one spine coil, and at least one neck coil; said MR system being equipped with a predetermined number of receivers; said coil interface comprising:
   (a) a plurality of input ports for coupling to said coils of said neurovascular coil system;
   (b) a plurality of output ports for coupling to said predetermined number of receivers of said MR system; and
   (c) an interface circuit for enabling said input ports and said output ports to be selectively interconnected and thereby enable said neurovascular coil system to be selectively operated in (I) a neurovascular mode; (II) a high resolution brain mode; (III) a high speed brain mode; (IV) a high resolution brain and c-spine mode; (V) a cervical spine mode; and (VI) a volume neck mode.

2. The coil interface of claim 1 wherein said plurality of input ports includes:
   (a) a first input port for receiving an in-phase signal from said birdcage coil;
   (b) a second input port for receiving a quadrature signal from said birdcage coil;

(c) a third input port for receiving a first spine signal from a first of said at least one spine coil;

(d) a fourth input port for receiving a second spine signal from a second of said at least one spine coil;

(e) a fifth input port for receiving a first neck signal from a first of said at least one neck coil; and (f) a sixth input port for receiving a second neck signal from a second of said at least one neck coil;

wherein in said neurovascular mode said interface circuit interconnects (i) said first and said second input ports to first of said output ports; (ii) said third and said fourth input ports to a second of said output ports; (iii) said fifth input port to a third of said output ports; and (iv) said sixth input port to a fourth of said output ports.

3. The coil interface of claim 2 wherein said in-phase and said quadrature signals received by said first and said second input ports, respectively, are phase shifted relative to one another before being combined and applied to said first output port.

4. The coil interface of claim 2 wherein said first and said second spine signals received by said third and said fourth input ports, respectively, are phase shifted relative to one another before being combined and applied to said second output port.

5. The coil interface of claim 1 wherein said plurality of input ports includes:

(a) a first input port for receiving an in-phase signal from said birdcage coil; and (b) a second input port for receiving a quadrature signal from said birdcage coil;

wherein in said high resolution brain mode said interface circuit interconnects (i) said first input port to one of said output ports and (ii) said second input port to an other of said output ports, thereby allowing said in-phase signal to be applied to said one output port and said quadrature signal to be applied to said other output port.

6. The coil interface of claim 1 wherein said plurality of input ports includes:

(a) a first input port for receiving an in-phase signal from said birdcage coil; and (b) a second input port for receiving a quadrature signal from said birdcage coil;

wherein in said high speed brain mode said interface circuit interconnects said first and said second input ports to first of said output ports with said in-phase and said quadrature signals received by said first and said second input ports, respectively, being phase shifted relative to one another before being combined and applied to said first output port.

7. The coil interface of claim 1 wherein said plurality of input ports includes:

(a) a first input port for receiving an in-phase signal from said birdcage coil;

(b) a second input port for receiving a quadrature signal from said birdcage coil;

(c) a third input port for receiving a first spine signal from a first of said at least one spine coil; and (d) a fourth input port for receiving a second spine signal from a second of said at least one spine coil;

wherein in said high resolution brain and c-spine mode said interface circuit interconnects (i) said first input port a first of said output ports thereby allowing said in-phase signal to be applied to said first output port; (ii) said second input port to a second of said output ports thereby allowing said quadrature signal to be applied to said second output port; (iii) said third input port to a third of said output ports thereby allowing said first spine signal to be applied to said third output port; and (iv) said fourth input port to a fourth of said output ports thereby allowing said second spine signal to be applied to said fourth output port.

8. The coil interface of claim 1 wherein said plurality of input ports includes:

(a) a first input port for receiving a first spine signal from said at least one spine coil; and (b) a second input port for receiving a second spine signal from said at least one spine coil;

wherein in said cervical spine mode said interface circuit interconnects (i) said first input port to a first of said output ports thereby allowing said first spine signal to be applied to said first output port; and (ii) said second input port to a second of said output ports thereby allowing said second spine signal to be applied to said second output port.

9. The coil interface of claim 1 wherein said plurality of input ports includes:

(a) a first input port for receiving a first spine signal from said at least one spine coil;

(b) a second input port for receiving a second spine signal from said at least one spine coil;

(c) a third input port for receiving a first neck signal from said at least one neck coil; and (d) a fourth input port for receiving a second neck signal from said at least one neck coil;

wherein in said volume neck mode said interface circuit interconnects (i) said first input port to a first of said output ports thereby allowing said first spine signal to be applied to said first output port; (ii) said second input port to a second of said output ports thereby allowing said second spine signal to be applied to said second output port; (iii) said third input port to a third of said output ports thereby allowing said first neck signal to be applied to said third output port; and (iv) said fourth input port to a fourth of said output ports thereby allowing said second neck signal to be applied to said fourth output port.

10. The coil interface of claim 1 wherein said plurality of input ports includes:

(a) a first input port for receiving a first spine signal from said at least one spine coil;

(b) a second input port for receiving a second spine signal from said at least one spine coil;

(c) a third input port for receiving a first neck signal from said at least one neck coil; and (d) a fourth input port for receiving a second neck signal from said at least one neck coil;

wherein in said volume neck mode said interface circuit interconnects (i) said first and said second input ports to a first of said output ports, with said first and said second spine signals received thereby being phase shifted relative to one another before being combined and applied to said first output port; (ii) said third input port to a second of said output ports thereby allowing said first neck signal to be applied to said second output port; and (iii) said fourth input port to a third of said output ports thereby allowing said second neck signal to be applied to said third output port.

11. The coil interface of claim 1 wherein said plurality of input ports includes:
  (a) a first input port for receiving a first spine signal from said at least one spine coil;
  (b) a second input port for receiving a second spine signal from said at least one spine coil; and
  (c) a third input port for receiving a neck signal from said at least one neck coil;
  wherein in said volume neck mode said interface circuit interconnects (i) said first and said second input ports to a first of said output ports, with said first and said second spine signals received thereby being phase shifted relative to one another before being combined and applied to said first output port; and (ii) said third input port to a second of said output ports thereby allowing said neck signal to be applied to said second output port.

12. The coil interface of claim 1 wherein said plurality of input ports includes:
  (a) a first input port for receiving said in-phase signal from said birdcage coil; and
  (b) a second input port for receiving said quadrature signal from said birdcage coil;
  wherein said interface circuit is switchable between interconnecting (i) said first and said second input ports one of said output ports with said in-phase and said quadrature signals being phase shifted relative to one another, combined and applied to said one of said output ports; and (ii) said first and said second input ports, and applying said in-phase and said quadrature signals received respectively thereby, to a first and a second of said output ports, respectively.

13. The coil interface of claim 1 wherein a conductive path through said interface circuit between any ne of said of input ports and any one of said output ports has an electrical length that is approximately equal to an integer multiple of half wavelengths.

14. The coil interface of claim 1 wherein said interface circuit allows said neurovascular coil system to be switched remotely between said modes of operation.

15. The coil interface of claim 14 wherein said interface circuit includes a combiner circuit for at least on of said coils for remotely switching said neurovascular coil system between said modes of operation, aid combiner circuit comprising at least one remotely operable PIN diode and a 90 degree phase shifting circuit.

16. The coil interface of claim 14 wherein said interface circuit includes at least one PIN diode operable from a console of said MR system for switching said neurovascular coil system between said modes of operation.

17. The coil interface of claim 16 wherein said MR system determines which of said modes of operation of said neurovascular coil system to support by detecting via said receivers of said MR system a bias pattern of said at least one PIN diode.

18. A method of operating a neurovascular coil system with a magnetic resonance (MR) system; said neurovascular coil system having an array of coils including a birdcage coil, at least one spine coil, and at east one neck coil; said MR system having a predetermined number of receivers; said method comprising the steps of:
  (a) providing a plurality of input ports for coupling to said coils of said neurovascular coil system;
  (b) providing a plurality of output ports for coupling to said predetermined number of receivers of said MR system; and
  (c) selectively interconnecting said input ports and said output ports and thereby enable said neurovascular coil system to be selectively operated in (I) a neurovascular mode; (II) a high resolution brain mode; (III) a high speed brain mode; (IV) a high resolution brain and c-spine mode; (V) a cervical spine mode; and (VI) a volume neck mode.

19. The method of claim 18 wherein said plurality of input ports includes:
  (a) a first input port for receiving an in-phase signal from said birdcage coil;
  (b) a second input port for receiving a quadrature signal from said birdcage coil;
  (c) a third input port for receiving a first spine signal from a first of said at least one spine coil;
  (d) a fourth input port for receiving a second spine signal from a second of said at least one spine coil;
  (e) a fifth input port for receiving a first neck signal from a first of said at least one neck coil; and
  (f) a sixth input port for receiving a second neck signal from a second of said at least one neck coil;
  wherein in said neurovascular mode (i) said first and said second input ports are interconnected to a first of said output ports; (ii) said third and said fourth input ports are interconnected to a second of said output ports; (iii) said fifth input port is interconnected to a third of said output ports; and (iv) said sixth input port is interconnected to a fourth of said output ports.

20. The method of claim 19 wherein said in-phase and said quadrature signals received by said first and said second input ports, respectively, are phase shifted relative to one another before being combined and applied to said first output port.

21. The method of claim 19 wherein said first and said second spine signals received by said third and said fourth input ports, respectively, are phase shifted relative to one another before being combined and applied to said second output port.

22. The method of claim 18 wherein said plurality of input ports includes:
  (a) a first input port for receiving an in-phase signal from said birdcage coil; and
  (b) a second input port for receiving a quadrature signal from said birdcage coil;
  wherein in said high resolution brain mode (i) said first input port is interconnected to one of said output ports and (ii) said second input port is interconnected to an other of said output ports, thereby allowing said in-phase signal to be applied to said one output port and said quadrature signal to be applied to said other output port.

23. The method of claim 18 wherein said plurality of input ports includes:
  (a) a first input port for receiving an in-phase signal from said birdcage coil; and
  (b) a second input port for receiving a quadrature signal from said birdcage coil;
  wherein, in said high speed brain mode, said first and said second input ports are interconnected to a first of said output ports with said in-phase and said quadrature signals received by said first and said second input ports, respectively, being phase shifted relative to one another before being combined and applied to said first output port.

24. The method of claim 18 wherein said plurality of input ports includes:
   (a) a first input port for receiving an in-phase signal from said birdcage coil;
   (b) a second input port for receiving a quadrature signal from said birdcage coil;
   (c) a third input port for receiving a first spine signal from a first of said at least one spine coil; and
   (d) a fourth input port for receiving a second spine signal from a second of said at least one spine coil;
   wherein in said high resolution brain and c-spine mode (i) said first input port is interconnected to a first of said output ports thereby allowing said in-phase signal to be applied to said first output port; (ii) said second input port is interconnected to a second of said output ports thereby allowing said quadrature signal to be applied to said second output port; (iii) said third input port is interconnected to a third of said output ports thereby allowing said first spine signal to be applied to said third output port; and (iv) said fourth input port is interconnected to a fourth of said output ports thereby allowing said second spine signal to be applied to said fourth output port.

25. The method of claim 18 wherein said plurality of input ports includes:
   (a) a first input port for receiving a first spine signal from said at least one spine coil; and
   (b) a second input port for receiving a second spine signal from said at least one spine coil;
   wherein in said cervical spine mode (i) said first input port is interconnected to a first of said output ports thereby lowing said first spine signal to be applied to said first output port; and (ii) said second input port is interconnected to a second of said output ports thereby allowing said second spine signal to be applied to said second output port.

26. The method of claim 18 wherein said plurality of input ports includes:
   (a) a first input port for receiving a first spine signal from said at least one spine coil;
   (b) a second input port for receiving a second spine signal from said at least one spine coil;
   (c) a third input port for receiving a first neck signal from said at least one neck coil; and
   (d) a fourth input port for receiving a second neck signal from said at least one neck coil;
   wherein in said volume neck mode (i) said first input port is interconnected to a first of said output ports thereby allowing said first spine signal to be applied to said first output port; (ii) said second input port is interconnected to a second of said output ports thereby allowing said second spine signal to be applied to said second output port; (iii) said third input port is interconnected to a third of said output ports thereby allowing said first neck signal to be applied to said third output port; and (iv) said fourth input port is interconnected to a fourth of said output ports thereby allowing said second neck signal to be applied to said fourth output port.

27. The method of claim 18 wherein said plurality of input ports includes:
   (a) a first input port for receiving a first spine signal from said at least one spine coil;
   (b) a second input port for receiving a second spine signal from said at least one spine coil;
   (c) a third input port for receiving a first neck signal from said at least one neck coil; and
   (d) a fourth input port for receiving a second neck signal from said at least one neck coil;
   wherein in said volume neck mode (i) said first and said second input ports are interconnected to a first of said output ports, with said first and said second spine signals received thereby being phase shifted relative to on another before being combined and applied to said first output port; (ii) said third input port is interconnected to a second of said output ports thereby allowing said first neck signal to be applied to said second output port; and (iii) said fourth input port is interconnected to a third of said output ports thereby lowing said second neck signal to be applied to said third output port.

28. The method of claim 18 wherein said plurality of input ports includes:
   (a) a first input port for receiving a first spine signal from said at least one spine coil;
   (b) a second input port for receiving a second spine signal from said at least one spine coil; and
   (c) a third input port for receiving a neck signal from said at least one neck coil;
   wherein in said volume neck mode (i) said first and said second input ports are interconnected to a first of said output ports, with said first and said second spine signals received thereby being phase shifted relative to on another before being combined and applied to said first output port; and (ii) said third input port is interconnected to a second of said output ports thereby allowing said neck signal to be applied to said second output port.

29. The method of claim 18 wherein said plurality of input ports includes:
   (a) a first input port for receiving said in-phase signal from said birdcage coil; and
   (b) a second input port for receiving said quadrature signal from said birdcage coil;
   such that said neurovascular coil system is capable of being switched between (I) said high speed brain mode wherein said first and said second input ports are interconnected to one of said output ports with said in-phase and said quadrature signals being phase shifted relative to one another, combined and applied to said one of said output ports; and (II) said high resolution brain mode wherein said first and said second input ports are interconnected to, and apply said in-phase and said quadrature signals received respectively thereby, to a first and a second of said output ports, respectively.

30. The method of claim 18 further comprising the step of effectively disabling said coils that are unused in accordance with a particular one of said modes of operation currently selected.

31. The method of claim 18 wherein the step of selectively interconnecting said input ports and said output ports is accomplished by changing a state of at least one PIN diode so as to switch said neurovascular coil system between said modes of operation.

32. The method of claim 31 wherein said MR system determines which of said modes of operation of said neurovascular coil system to support by detecting via said receivers of said MR system a bias pattern of said at least one PIN diode.

33. The method of claim 18 wherein the step of selectively interconnecting said input ports and said output ports is carried out by using at least one combiner circuit for remotely switching said neurovascular coil system between said modes of operation, said combiner circuit comprising at least one remotely operable PIN diode and a 90 degree phase shifting circuit.

34. The method of claim 18 wherein a conductive path between any one of said input ports and any one of said output ports has an electrical length that is approximately equal to an integer multiple of half wavelengths.

35. A neurovascular coil system for coupling to a magnetic resonance (MR) system, said MR system being equipped with a predetermined number of receivers, said neurovascular coil system comprising:
  (a) an array of coils including a birdcage coil, at least one spine coil, and at least one neck coil;
  (b) a plurality of input ports with said birdcage coil connected to at least one of said input ports, said at least on spine coil connected to at least one of said input ports and said at least one neck coil connected to at least one of said input ports;
  (c) a plurality of output ports for coupling to said predetermined number of receivers of said MR system; and
  (d) an interface circuit for enabling said input ports and said output ports to be selectively interconnected and thereby enable said neurovascular coil system to be selectively operated in (I) a neurovascular mode; (II) a high resolution brain mode; (III) a high speed brain mode; (IV) a high resolution brain and spine mode; (V) a cervical spine mode; and (VI) a volume neck mode.

36. The neurovascular coil system of claim 35 wherein in said neurovascular mode:
  (a) said birdcage coil by a first and a second of said input ports is interconnected to a first of said output ports, thereby enabling an in-phase signal and a quadrature signal from said birdcage coil to be applied through said first output port to a first of said receivers of said MR system;
  (b) said at least one spine coil by a third and a fourth of said input ports is interconnected to a second of said output ports, thereby enabling a first spine signal from a first of said at least one spine coil and a second spine signal from a second of said at least one spine coil to be applied through said second output port to second of said receivers of said MR system; and
  (c) said at least one neck coil by a fifth and a sixth of said input ports is interconnected to a third and a fourth, respectively, of said output ports, thereby enabling a first neck signal from a first of said at least one neck coil and a second neck signal from a second of said at least one neck coil to be applied through said third and said fourth output ports, respectively, to a third and a fourth of said receivers, respectively, of said MR system.

37. The neurovascular coil system of claim 36 wherein:
  (a) said in phase and said quadrature signals of said birdcage coil received by said first and said second input ports, respectively, are within said interface circuit phase shifted relative to one another before being combined and applied to said first output port; and
  (b) said first and said second spine signals of said at least one spine coil received by said third and said fourth input ports, respectively, are within said interface circuit phase shifted relative to one another before being combined and applied to said second output port.

38. The neurovascular coil system of claim 35 wherein in said high resolution brain mode said birdcage coil by a first and a second of said input ports is interconnected to a first and a second, respectively, of said output ports, thereby enabling an in-phase signal and a quadrature signal from said birdcage coil to be applied through said first and said second output ports to a first and a second, respectively, of said receivers of said MR system.

39. The neurovascular coil system of claim 35 wherein in said high speed brain mode said birdcage coil by a first and a second of said input ports is interconnected to a first of said output ports, with an n-phase signal and a quadrature signal of said birdcage coil received by said first and said second input ports, respectively, being phase shifted relative to one another before being combined and applied to said first output port by said interface circuit.

40. The neurovascular coil system of claim 35 wherein in said high resolution brain and c-spine mode:
  (a) said birdcage coil by a first and a second of said input ports is interconnected to a first and a second, respectively, of said output ports, thereby enabling an in-phase signal and a quadrature signal from said birdcage coil to be applied through said first and said second output ports to a first and a second, respectively of said receivers of said MR system; and
  (b) said at least one spine coil by a third and a fourth of said input ports is interconnected to a third and a fourth, respectively, of said output ports, thereby enabling a first spine signal from a first of said at least one spine coil and a second spine signal from a second of said at least one spine coil to be applied through said third and said fourth output ports, respectively, to a third and a fourth of said receivers, respectively, of said MR system.

41. The neurovascular coil system of claim 35 wherein in said cervical spine mode said at least one spin coil by a first and a second of said input ports is interconnected to a first and a second, respectively, of said output ports, thereby enabling a first spine signal from a first of said at least one spine coil and a second spine signal from a second of said at least one spine coil to be applied through said first an said second output ports, respectively, to a first and a second of said receivers, respectively, of said system.

42. The neurovascular coil system of claim 35 wherein in said volume neck mode:
  (a) said at least one spine coil by a first and a second of said input ports is interconnected to a first and a second, respectively, of said output ports, thereby enabling a first spine signal from a first of said at least one spine coil and a second spine signal from a second of said at least one spine coil to be applied through said first and said second output ports, respectively, to a first and a second of said receivers, respectively, of said MR system; and
  (b) said at least one neck coil by a third and a fourth of said input ports is interconnected to a third and a fourth, respectively, of said output ports, thereby enabling a first neck signal from a first of said at least one neck coil and a second neck signal from a second of said at least one neck coil to be applied through said third and said fourth output ports, respectively, to a third and a fourth of said receivers, respectively, of said MR system.

43. The neurovascular coil system of claim 35 wherein in said volume neck mode:
  (a) said at least one spine coil by a first and a second of said input ports is interconnected to a first of said output arts, with a first spine signal and a second spine signal received by said first and said second input ports, respectively, being phase shifted relative to one another before being combined and applied to said first output port by said interface circuit; and (b) said at least one neck coil by a third and a fourth of said input ports is interconnected to a second and a third, respectively, of said output ports, thereby enabling a first neck signal from a first of said at least one neck coil and a second neck signal from a second of said at least one neck coil to be applied through said second and said third output ports, respectively, to a second and a third of said receivers, respectively, of said MR system.

44. The neurovascular coil system of claim 35 wherein in said volume neck mode:

(a) said at least one spine coil by a first and a second of said input ports is interconnected to a first of said output ports, with a first spine signal and a second spine signal received by said first and said second input ports, respectively, being phase shifted relative to one another before being combined and applied to said first output port by said interface circuit; and (b) said at least one neck coil by a third of said input ports is interconnected to a second of said output ports, the by allowing a neck signal from said at least one neck coil to be applied to said second output port.

45. A magnetic resonance (MR) system comprising:

(a) a predetermined number of receivers; and (b) a neurovascular coil system operably connectable to said MR system, said neurovascular coil system including (i) an array of coils including a birdcage coil, at least one spine coil, and at least one neck coil;

(ii) a plurality of input ports with said birdcage coil connected to at least one of said input ports, said at least one spine coil connected to at least one of said input ports and said at least one neck coil connected to at least one of said input ports;

(iii) a plurality of output ports for coupling to said predetermined number of receivers of said MR system; and (iv) an interface circuit for enabling said input ports and said output ports to be selectively interconnected;

thereby enabling said neurovascular coil system to be selectively operated via said MR system in (A) a neurovascular mode; (B) a high resolution brain mode; (C) a high speed brain mode; (D) a high resolution brain and c-spine mode; (E) a cervical spine mode; and (F) a volume neck mode.

* * * * *